US009736966B1

(12) United States Patent
Anderl et al.

(10) Patent No.: US 9,736,966 B1
(45) Date of Patent: Aug. 15, 2017

(54) HEAT SINK WITH INTEGRATED THREADED LID

(71) Applicant: International Business Machines Corporation, Armonk, NY (US)

(72) Inventors: William J. Anderl, Rochester, MN (US); Bret P. Elison, Rochester, MN (US); Phillip V. Mann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/040,024

(22) Filed: Feb. 10, 2016

(51) Int. Cl.
*H05K 7/20* (2006.01)
*H01L 23/367* (2006.01)
*H05K 1/02* (2006.01)
*G06F 1/20* (2006.01)

(52) U.S. Cl.
CPC ........... *H05K 7/20154* (2013.01); *G06F 1/20* (2013.01); *H01L 23/3675* (2013.01); *H05K 1/0203* (2013.01); *H05K 7/2039* (2013.01)

(58) Field of Classification Search
CPC ..... H01L 23/34; H01L 23/36; H01L 23/3675; H01L 2023/405; H01L 23/4087
USPC ................................................. 361/709–710
See application file for complete search history.

(56) References Cited

U.S. PATENT DOCUMENTS

| 3,229,756 | A | * | 1/1966 | Keresztury | H01L 23/4006 165/67 |
| 4,345,267 | A | * | 8/1982 | Corman | H01L 23/4093 165/80.2 |
| 4,396,935 | A | * | 8/1983 | Schuck | H01L 23/057 174/541 |
| 4,918,571 | A | * | 4/1990 | Grabbe | H01L 23/04 174/16.3 |
| 5,256,902 | A | * | 10/1993 | Culver | H01L 23/40 165/80.3 |
| 5,313,099 | A | * | 5/1994 | Tata | H01L 23/4006 257/706 |
| 5,353,193 | A | * | 10/1994 | Chia | F02F 7/00 165/185 |
| 5,397,919 | A | * | 3/1995 | Tata | H01L 23/4006 257/706 |
| 5,566,052 | A | * | 10/1996 | Hughes | H01L 23/367 174/354 |

(Continued)

FOREIGN PATENT DOCUMENTS

EP  1548827 A1  6/2005

OTHER PUBLICATIONS

Occhionero et al., "Aluminum Silicon Carbide (ALSIC) Microprocessor Lids and Heat Sinks or Integrated Thermal Management Solutions", IMAPS Denver April 26-28, 2000, pp. 1-5, Denver CO.

(Continued)

*Primary Examiner* — Adrian S Wilson
(74) *Attorney, Agent, or Firm* — Law Office of Jim Boice

(57) ABSTRACT

A heat sink structure includes a heat sink; a threaded heat sink base pocket within the heat sink; a module lid, where the module lid thermally interfaces with a die; a threaded exterior portion of the module lid; and a thread engagement between the threaded heat sink base pocket and the threaded exterior portion of the module lid, where the thread engagement mechanically couples the heat sink to the module lid.

6 Claims, 3 Drawing Sheets

CROSS SECTION A-A'

(56) References Cited

U.S. PATENT DOCUMENTS

| | | | | |
|---|---|---|---|---|
| 5,579,827 | A * | 12/1996 | Chung | H01L 23/4093 165/121 |
| 5,708,564 | A * | 1/1998 | Lin | H01L 23/4093 165/185 |
| 5,774,335 | A * | 6/1998 | Pare | H01L 23/4093 257/718 |
| 5,815,921 | A * | 10/1998 | Burward-Hoy | B23P 11/025 165/80.3 |
| 6,021,045 | A * | 2/2000 | Johnson | H01L 23/3677 165/185 |
| 6,252,774 | B1 * | 6/2001 | Rife | H01L 23/3675 257/727 |
| 6,343,012 | B1 * | 1/2002 | Rife | H01L 23/467 165/185 |
| 6,549,407 | B1 * | 4/2003 | Sauciuc | H01L 23/3675 165/80.4 |
| 6,695,042 | B1 * | 2/2004 | Boudreaux | F28F 13/00 165/104.21 |
| 6,828,673 | B2 * | 12/2004 | Ficorilli | H01L 23/367 257/706 |
| 6,847,106 | B1 | 1/2005 | Howard et al. | |
| 7,352,575 | B2 * | 4/2008 | Anderl | H05K 7/20727 165/104.33 |
| 7,896,679 | B2 | 3/2011 | Hsu et al. | |
| 7,905,276 | B2 * | 3/2011 | Clough | G06F 1/20 165/80.4 |
| 8,807,202 | B2 * | 8/2014 | Wang | H01L 23/40 165/79 |
| 2005/0034841 | A1 | 2/2005 | Barr et al. | |
| 2005/0207123 | A1 * | 9/2005 | Atkinson | H01L 23/4006 361/709 |
| 2005/0265000 | A1 * | 12/2005 | He | H01L 23/4006 361/709 |
| 2014/0138811 | A1 | 5/2014 | Pandey et al. | |
| 2014/0367847 | A1 | 12/2014 | Strader et al. | |

OTHER PUBLICATIONS

List of IBM Patents or Patent Applications Treated as Related, Oct. 5, 2016, p. 1-2.

* cited by examiner

CROSS SECTION A-A'

HEAT SINK WITH INTEGRATED THREADED LID

BACKGROUND

The present disclosure relates to the field of electronic circuits, and specifically to cooling devices used in electronic circuits. Still more specifically, the present invention relates to heat sinks used as cooling devices in electronic circuits.

SUMMARY

In an embodiment of the present invention, a heat sink structure includes a heat sink; a threaded heat sink base pocket within the heat sink; a module lid, where the module lid thermally interfaces with a die; a threaded exterior portion of the module lid; and a thread engagement between the threaded heat sink base pocket and the threaded exterior portion of the module lid, where the thread engagement mechanically couples the heat sink to the module lid.

In an embodiment of the present invention, a circuit board includes the heat sink structure described above.

In an embodiment of the present invention, a computing device includes an air moving device and a circuit board that includes the heatsink structure described above.

DETAILED DESCRIPTION

Electronics cooling for packaged modules often uses two methods of mounting/mating their cooling solution: mounting hardware and adhesive thermal interface material (TIM). In the prior art, mounting hardware used clips, screws, springs, etc. that provided tensions between the cooling solution (e.g., a heat sink) and the device being cooled (e.g., an integrated circuit (IC), also known as a "die", which is a small block of semiconducting material on which a functional circuit is fabricated). The adhesive TIM provides thermal conduction between the heat sink and the die.

Mounting hardware poses several problems.

First, mounting hardware takes up high quality board space and is sometimes impossible to use on various modules. That is, springs, clips, etc. not only take up space in a system, they are also difficult to manipulate.

Second, mounting hardware is not adjustable. That is, a clip/spring simply holds the heat sink down at a certain pressure, which is fixed. This results in undue pressure on connectors (between the die and a circuit board) as well as on the die itself.

Third, mounting hardware such as ball grid array (BGA) spring clips (used on modules to provide actuation to small heat sinks and used in conjunction with high performance TIMs) have the drawbacks of reduction in heat sink performance (due to poor mating between the heat sink and the die); solder ball stress/integrity issues (due to undue pressure against the die by the BGA spring clips); the inability to support high loads (due to the limited strength of the springs in the BGA spring clips); and the inability to survive shock/vibe requirements (due to the limited resilience provided by BGA spring clips).

Furthermore, adhesive thermal interface materials (TIMs), when used alone to adhere a heat sink to a die are among the lowest performers for thermal conductivity since they are mainly composed of polymer adhesive. Furthermore, adhesive TIMs are also extremely difficult to rework or remove, since they are an adhesive (glue) that permanently bonds the heat sink to the die.

Other actuation hardware requires board space and sometimes holes in the board in order to have retention. This is the most undesirable option since board space near modules is at a premium and any hardware in these regions takes away from the capability and/or signal integrity of the whole system.

Figure 1:
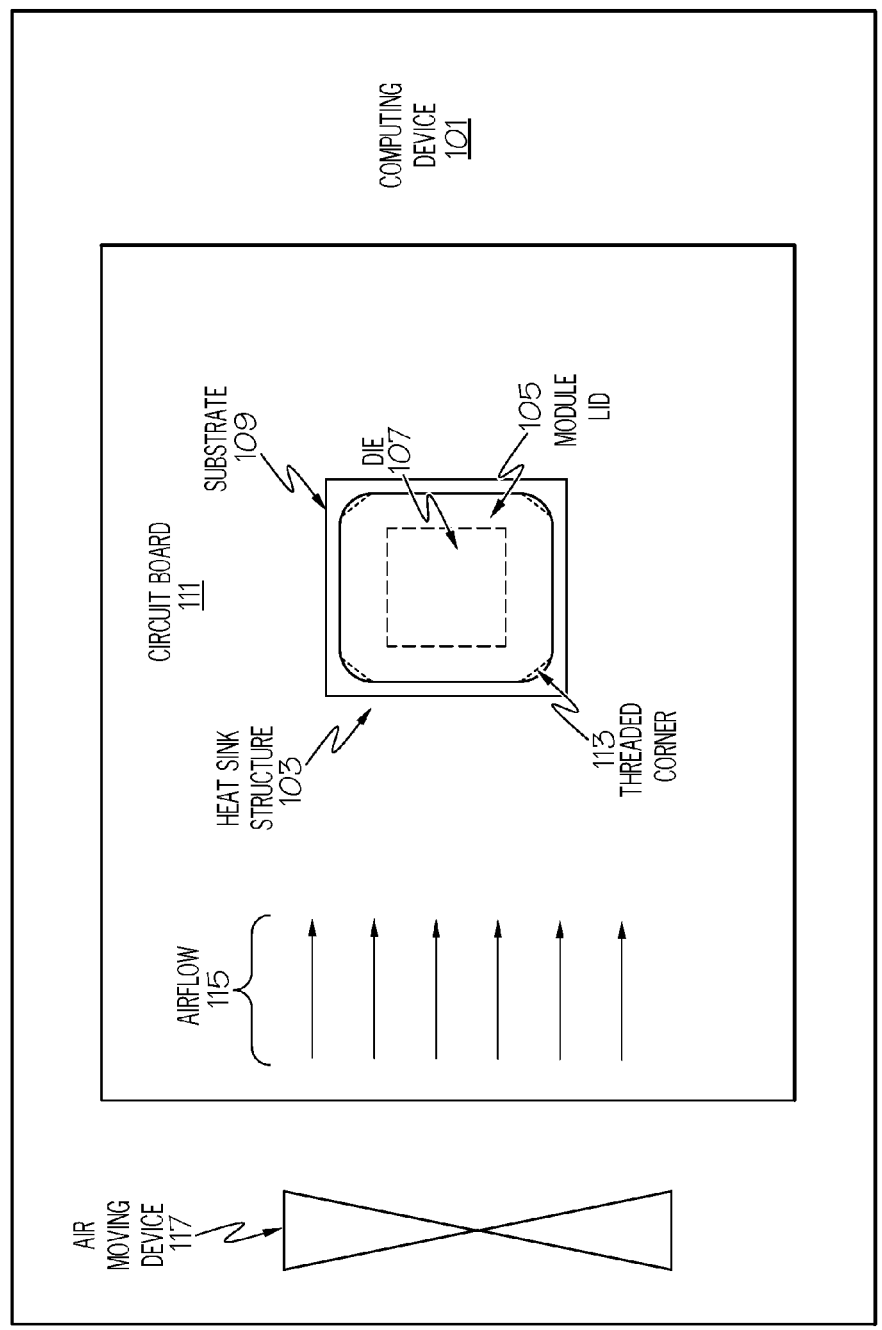
FIG. 1 depicts an exemplary computing device into which a novel heat sink structure is incorporated.

With reference now to the figures, and specifically to FIG. 1, an exemplary computing device 101 into which the presently-presented and novel heat sink structure 103 is incorporated is presented. Heat sink structure 103 includes a module lid 105, which is mounted atop a die 107 (e.g., an integrated circuit), which is mounted atop a substrate 109 (e.g., a glass epoxy that supports internal wires to external connectors), which is mounted on a circuit board 111 (e.g. a glass epoxy structure that supports various integrated circuits, power supplies, fans, input/output interfaces, etc.).

As shown in FIG. 1, in an embodiment of the present invention module lid 105 has a polygonal shape (e.g., a square) that has multiple threaded corners, such as threaded corner 113. When a heat sink (shown in FIGS. 2-3 but not FIG. 1) is fully engaged with the module lid 105, airflow 115 from an air moving device 117 (e.g., a cooling fan within a housing of computing device 101 and/or mounted on the circuit board 111 itself) flows parallel to (and thus unimpeded by) cooling vanes on the heat sink. Additional details of the heat sink structure 103 are shown below in FIGS. 2-3.

Figure 2:
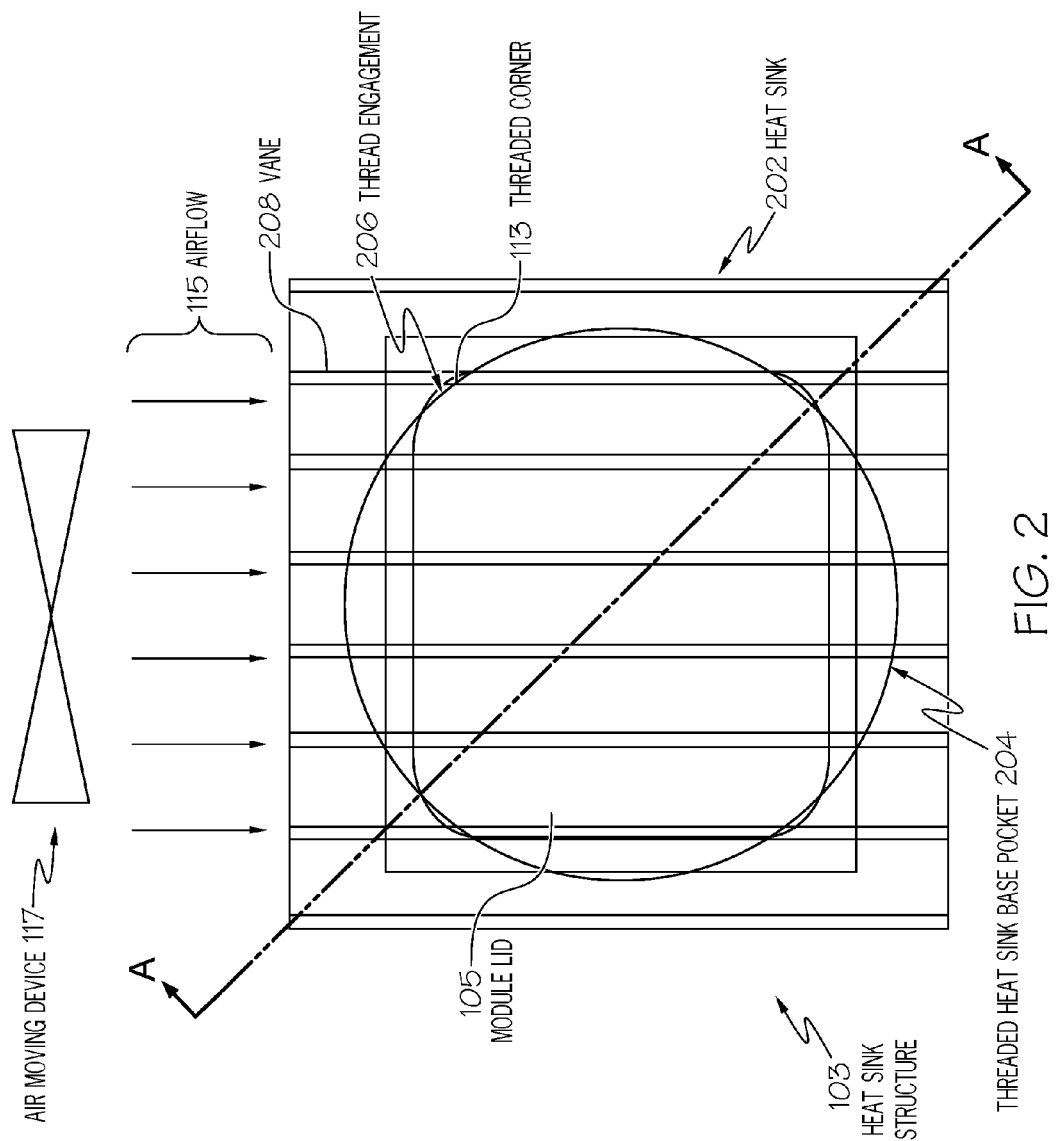
FIG. 2 illustrates a top view of the novel heat sink structure presented herein.

With reference now to FIG. 2, a top view of the novel heat sink structure 103 introduced in FIG. 1 is presented. As shown in FIG. 2, a heat sink 202 is mounted over the module lid 105. Heat sink 202 has a threaded heat sink base pocket 204, which is screwed onto the threaded corners (e.g., threaded corner 113) of module lid 105 to form multiple thread engagements (e.g., thread engagement 206). Thus, heat sink 202 is screwed down onto module lid 105 until 1) solid mechanical and thermal contact is established between heat sink 202 and module lid 105, and 2) the airflow 115 from air moving device 117 flows unobstructed across the vanes (e.g., vane 208) on heat sink 202.

Figure 3:
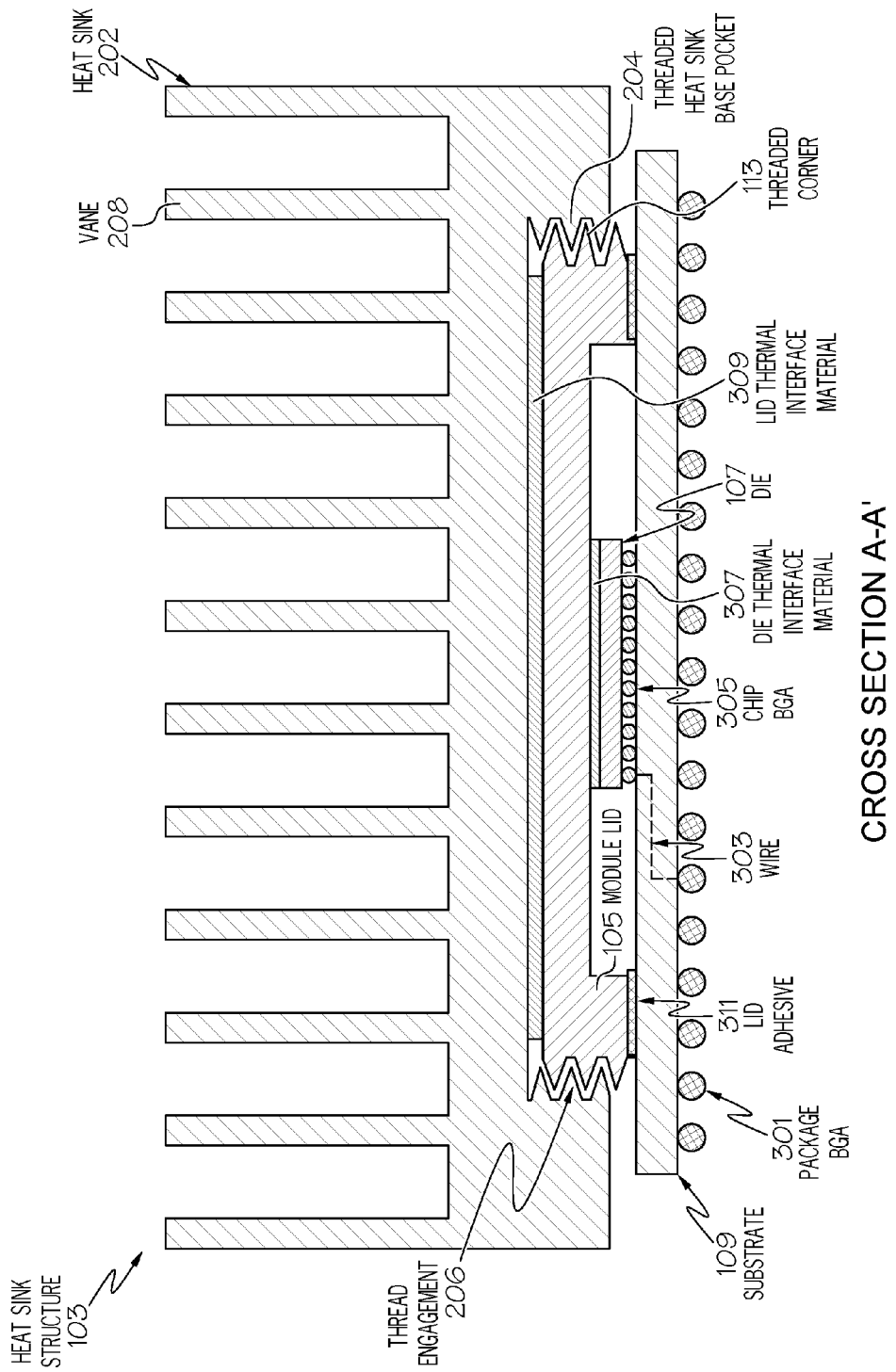
FIG. 3 depicts a cross-sectional view of the heat sink structure shown in FIG. 2.

With reference now to FIG. 3, a cross-sectional view of the heat sink structure 103 shown in FIG. 2 is presented.

As shown in FIG. 3, a package ball grid array (BGA) 301 provides electrical connections between a planar (i.e., a printed circuit board—not shown) and the die 107 using internal wiring, such as the depicted wire 303 that connects one of the solder balls from package BGA 301 to one or more of the solder balls in the chip BGA 305. The chip BGA 305 is connected to internal circuitry (not shown) within the die 107, which is thermally coupled by a die thermal interface material (TIM) 307 to the underside of the module lid 105. As depicted, module lid 105 is adhered to substrate 109 using a lid adhesive 311 (e.g., a heat resistant glue), thus providing a fixed combination of module lid 105, die 107, and substrate 109.

The present invention provides a novel and adjustable means for affixing the heat sink 202 to the module lid 105. That is, the heat sink 202 has a threaded heat sink base pocket 204, whose inner surfaces are threaded. These threaded inner surfaces from the threaded heat sink base pocket 204 screw onto the threaded corners (e.g., threaded corner 113) of the polygonal-shaped module lid 105 at areas such as the depicted thread engagement 206 area.

As a user screws the heat sink 202 down onto the module lid 105, the user is able to 1) selectively control the amount of pressure forced against the module lid 105; 2) evenly spread out the lid thermal interface material (TIM) 309 between the heat sink 202 and the module lid 105 by the rotational movement of the heat sink 202; and 3) align the orientation of the vanes (e.g., vane 208) such that airflow 115 from the air moving device 117 shown in FIGS. 1-2 flows between the vanes, thereby providing maximum heat removal.

Thus, as depicted and described herein, the corners of a lidded module are rounded and threaded such that a heat sink with a certain-depth threaded recess can be screwed on. Mounting a heat sink in this fashion prevents the need for board level mounting hardware and allows the use of a high quality thermal interface material. The threading is aligned such that at an optimal, nominal gap, the fins and heat sink orientation are properly aligned with the airflow direction. Given the planarity of lidded modules, this type of actuation has a beneficial effect on the thermal bond line directly over the hottest components, further improving thermal performance of the heat sink.

An additional benefit of the mounting scheme presented and described in the present disclosure and figures includes better electromagnetic interference (EMI) protection due to the intimate contact between the heat sink base and the module lid.

In an alternative embodiment of the present invention, a threaded ring is used on the previously described heat sink structure to provide a compliant surface for mounting a standard heat sink. This type of mounting allows a spring clip or other constant force mounting scheme without using board space or impacting signal integrity.

Having thus described embodiments of the present invention of the present application in detail and by reference to illustrative embodiments thereof, it will be apparent that modifications and variations are possible without departing from the scope of the present invention defined in the appended claims.

What is claimed is:

1. A heat sink structure comprising:
   a heat sink;
   a threaded heat sink base pocket within the heat sink;
   a module lid, wherein the module lid thermally interfaces with a die, and wherein the module lid has a polygonal shape that has corners;
   a threaded exterior portion of the module lid, wherein the threaded exterior portion of the module lid is only at the corners of the module lid; and
   a thread engagement between the threaded heat sink base pocket and the threaded exterior portion of the module lid, wherein the thread engagement mechanically couples the heat sink to the module lid.

2. The heat sink structure of claim 1, wherein the thread engagement is configured to align vanes of the heat sink parallel to an air flow from a cooling fan when the thread engagement mechanically thermally couples the heat sink to the module lid.

3. A circuit board comprising:
   a substrate electrically coupled to the circuit board;
   a die electrically coupled to the substrate;
   a heat sink structure mechanically and thermally coupled to the die, wherein the heat sink structure comprises:
   a heat sink;
   a threaded heat sink base pocket within the heat sink;
   a module lid, wherein the module lid thermally interfaces with a die, and wherein the module lid has a polygonal shape that has corners;
   a threaded exterior portion of the module lid, wherein the threaded exterior portion of the module lid is only at the corners of the module lid; and
   a thread engagement between the threaded heat sink base pocket and the threaded exterior portion of the module lid, wherein the thread engagement mechanically couples the heat sink to the module lid.

4. The circuit board of claim 3, wherein the thread engagement is configured to align vanes of the heat sink parallel to an air flow from a cooling fan when the thread engagement mechanically thermally couples the heat sink to the module lid.

5. A computing device comprising:
   an air moving device; and
   a circuit board comprising:
   a substrate electrically coupled to the circuit board;
   a die electrically coupled to the substrate; and
   a heat sink structure mechanically and thermally coupled to the die, wherein the heat sink structure comprises:
   a heat sink;
   a threaded heat sink base pocket within the heat sink;
   a module lid, wherein the module lid thermally interfaces with a die; and wherein the module lid has a polygonal shape that has corners;
   a threaded exterior portion of the module lid, wherein the threaded exterior portion of the module lid is only at the corners of the module lid; and
   a thread engagement between the threaded heat sink base pocket and the threaded exterior portion of the module lid, wherein the thread engagement mechanically couples the heat sink to the module lid.

6. The computing device of claim 5, wherein the thread engagement is configured to align vanes of the heat sink parallel to an air flow from the air moving device when the thread engagement mechanically thermally couples the heat sink to the module lid.

* * * * *